Dec. 12, 1961 M. FISCHMAN 3,013,219

TRANSISTOR BLOCKING OSCILLATOR USING RESONANT FREQUENCY STABILIZATION

Filed April 23, 1959 3 Sheets-Sheet 1

INVENTOR
MARTIN FISCHMAN
BY Harry Trunick
ATTORNEY

INVENTOR
MARTIN FISCHMAN
BY Harry Tunick
ATTORNEY

Dec. 12, 1961 M. FISCHMAN 3,013,219

TRANSISTOR BLOCKING OSCILLATOR USING RESONANT FREQUENCY STABILIZATION

Filed April 23, 1959 3 Sheets-Sheet 3

INVENTOR
MARTIN FISCHMAN
BY Harry Tunick
ATTORNEY 3,013,219

TRANSISTOR BLOCKING OSCILLATOR USING RESONANT FREQUENCY STABILIZATION

Martin Fischman, Wantagh, N.Y., assignor to Sylvania Electric Products Inc., a corporation of Delaware Filed Apr. 23, 1959, Ser. No. 808,354
5 Claims. (Cl. 331—112)

My present invention relates to transistor blocking oscillators.

Conventional transistor blocking oscillators are used to generate rectangular pulses or waveforms with current changing abruptly from an "on" value of current to an "off" condition wherein the current falls to zero. The width of the pulses generated corresponds to the "on" time of each cycle. The time of one cycle of the pulse frequency is given by the sum of an "on" and an "off" interval, the latter being known as the interpulse period.

As explained in copending U.S. patent application Serial No. 808,394, filed April 23, 1959, for which I am one of the joint applicants, the pulse width changes with transistor characteristics, circuit loading and operating voltages. Also in this application, there is described an arrangement wherein the pulse width is stabilized to a value equal to substantially one half cycle of the frequency to which a series resonant system, associated with the base of the transistor oscillator, is tuned.

Not only is the pulse width subject to variation, as explained in the application referred to, but I have found that the frequency of the pulses generated also varies in an undesirable way with operating conditions such as changes in transistor characteristics, etc. Accordingly, it is an object of my present invention to provide a new and useful transistor blocking oscillator in which the pulse rate is stable and substantially independent of changes in transistor characteristics, loading and operating voltages. A further object of my invention is to provide a new and useful transistor blocking oscillator of relatively simple structure in which both pulse width and pulse frequency are maintained stable.

It should be noted that the frequency of pulses generated by a transistor blocking oscillator depends, primarily, on the rate of discharge of a storage condenser in the oscillator. This time of discharge determines the interpulse period of the pulses and, hence, is an important factor in setting the frequency of pulses generated. As this condenser discharges, a point is reached, usually a zero point or point of complete discharge, which starts or enables the formation of the leading edge of the next pulse generated by the oscillator. Because the rate or slope of discharge varies with circuit parameters, the timing of the occurrence of the complete discharge of the condenser, or cross over of the waveform of discharge with a zero axis, become variable, giving rise to changes in the interpulse period and therefore the rate or frequency of pulse formation.

In accordance with my present invention, I add to the discharge of the condenser, the oscillations of a shock-excited parallel tuned system having inductance and capacity. This tuned system is tuned to a frequency such that the number of cycles that occur during the interpulse period is such that it equals some integer less ¼. The action of the arrangement is such that the waveform of discharge becomes very steep at the intersection of the discharge envelope and the zero axis. As a result the leading edges of the pulses formed by the oscillator occur sharply at definite time intervals determined by the tuning of the shock-excited, parallel tuned system.

This parallel resonant system for stabilizing interpulse periods, is, in a preferred form of my invention, used in part to form a series tuned system which acts to stabilize the pulse width to values corresponding to the time of one half cycle of the frequency to which the series tuned system is resonated. In this way, in accordance with my present invention, stabilization of both the period and the pulse width of the oscillator is simply and efficiently accomplished.

My invention will be described in greater detail with the aid of the accompanying drawing wherein.

Figure 1A:
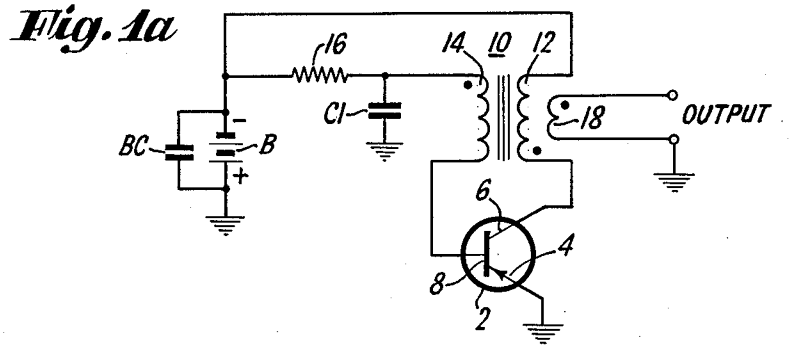
FIG. 1A is a schematic illustration of a conventional transistor blocking oscillator.

A conventional transistorized blocking oscillator subject to undesirable variations in pulse width and frequency is illustrated in FIG. 1. As shown, the oscillator makes use of a transistor 2 having an emitter 4, a collector 6 and a base 8. The emitter-collector circuit is regeneratively coupled to the emitter base circuit by way of a transformer 10 having a primary winding 12 and secondary winding 14. The circuit is energized from a direct current source here illustrated as a battery B, provided with a by-passing condenser BC, with the positive terminal of the battery grounded and its negative terminal connected to resistor 16 and to the primary 12 as shown. The frequency of pulses generated is controlled by the action, in general, of condenser $C_1$ and resistor 16. Output pulses are derived by way of coil 18, coupled to the transformer 10.

Figure 1B:
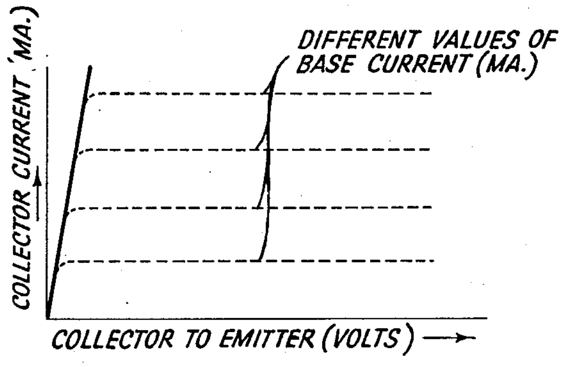
FIG. 1B is a typical collector characteristic of a transistor such as used in the circuit of FIG. 1A.

With regard to the operation of the conventional transistor blocking oscillator as shown in FIG. 1A, transformer 10 provides regenerative feedback from the collector to the base of the transistor upon initiation of current flow in the transistor. The magnitude of the feedback and the gain of the transistor are sufficient to cause the transistor current to build up rapidly causing operation in the saturation region of the transistor characteristic. In this region the collector current is independent of the base current as shown by the steeply inclined solid line of FIG. 1B. The transistor voltages remain practically constant and in a state of equilibrium for a period of time due to the lack of dynamic gain that exists in this saturation condition of operation. This voltage equilibrium state corresponds to the turned-on period or pulse width interval of the blocking oscillator. The equilibrium condition will continue until the transistor operating point moves out of the saturation region into a region of high dynamic gain. A regenerative process then commences and results in the rapid turn-off of the transistor. The termination of the equilibrium condition may come about as a result of an increasing collector current, a decreasing base current or a combination of both depending on the relative values of the capacitor $C_1$ and the primary inductance of transformer 10. Regardless of the mode of operation employed, the pulse width will be influenced by transistor characteristics, circuit loading and operating voltages.

Figure 2:
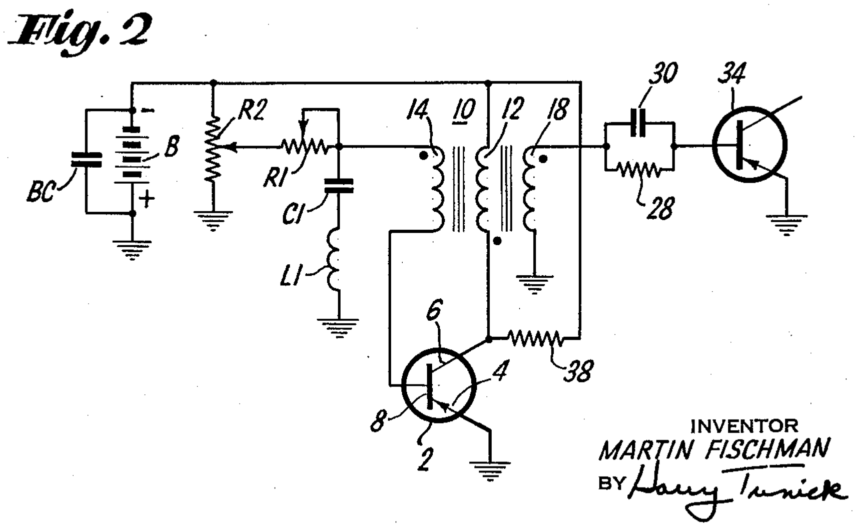
FIG. 2 is a wiring diagram of a transistor blocking oscillator using series resonant pulse width control as described in my joint application with William Geller Serial No. 808,394 filed April 23, 1959, Sylvania D–8626.

In accordance with the principles outlined in the copending application referred to hereinabove, pulse width control and stabilization are accomplished, as indicated in FIG. 2, by means of a series resonant system $C_1$, $L_1$. During each pulse cycle, base current, in the series resonant circuit, oscillates freely for a half cycle and sets pulse width to the value of the intercept between the intersections of the base current waveforms, with the zero axis.

More specifically, FIG. 2 herein is illustrative of the constant pulse width oscillator of the copending application referred to. With regard to FIG. 2, the blocking oscillator makes use of a transistor 2 having an emitter 4, a collector 6 and a base 8. The primary winding 12, connected in the collector-emitter circuit, regeneratively feeds back energy to the base emitter circuit by way of secondary winding 14. The base 8 is suitably polarized through variable resistors $R_2$ and $R_1$ supplied with negative voltage from battery B. The collector 6 is also polarized from the negative terminal of battery B.

In order to provide for pulse width stability in the arrangement of FIG. 2, the series tuned circuit, consisting of a condenser $C_1$ and inductance $L_1$, is connected, as shown, between ground and the upper end of secondary winding 14. The tuning of this circuit determines the pulse width which is made equal to the time interval of one half cycle of the resonant frequency of circuit $C_1$, $L_1$. The latter, shock excited by the base current, freely oscillates for half cycles. This can be understood more fully by referring to the idealized waveforms illustrated in FIG. 3.

Upon triggering of the oscillator of FIG. 2, a sine wave of current starts to flow in the base circuit starting at point $P_1$ zero current. The current increases from zero, goes through a maximum at 90° and finally diminishes to zero at 180° or at point $P_2$ thereby reducing the base drive to zero and turning off the oscillator. The maximum energy stored in the coil $L_1$ at 90° is transferred to the capacitor $C_1$. At 180° all of the energy is stored in the capacitor. The circuit remains quiescent until the charge on $C_1$ is removed and the next trigger is applied. FIG. 3B shows that the critical crossing of the zero current intercept in the base circuit occurs at a time $T_1$ equal to $\pi\sqrt{LC}$, where L is the coil inductance and C is the capacitance of capacitor $C_1$. The time $T_1$ is independent of the amplitude of the current and is therefore stable, being dependent solely on the reactive elements of the circuit. Pulse width control may be accomplished by variation of either coil $L_1$ or condenser $C_1$.

Figure 4:
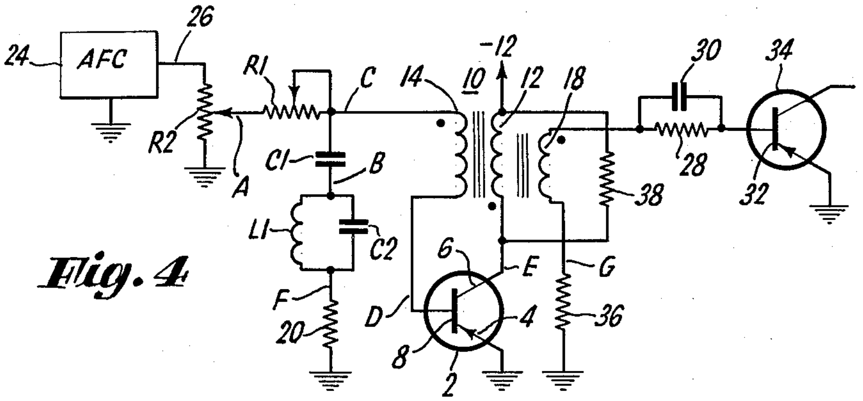
FIG. 4 is a wiring diagram of a transistor blocking oscillator, in accordance with my present invention, in which pulse frequency and pulse width are stabilized by resonant systems.

In the circuit of the present invention, shown in FIG. 4, the rate or frequency of the pulses generated, is stabilized. In addition, in the present invention, as illustrated in FIG. 4, pulse width stabilization is maintained along with pulse frequency stabilization, in a simple, effective way.

In the transistor blocking oscillator of FIG. 4, the transistor 2 is illustrated to be of the PNP type with a negative reverse voltage applied to the collector.

If desired, an NPN transistor may be used and positive voltage would be applied to the collector to back bias the same and the forward biasing voltage would be applied across the emitter 4 and the base 8 opposite in polarity to that indicated at FIG. 4.

Also, as illustrated in FIG. 4, the emitter-collector circuit includes the primary or a first winding 12 of transformer 10 which regeneratively feeds energy into the secondary or second winding 14. Secondary winding 14 is connected, as shown, in the base-emitter circuit in series with condenser $C_1$ and the parallel tuned circuit consisting of the condenser $C_2$ connected in parallel with coil $L_1$. Also in the circuit between the base 8 and the grounded emitter 4 is the low value sampling resistor 20, the lower end of which is grounded, as illustrated. Negative polarizing voltage is fed to variable resistors $R_2$ and $R_1$ as shown through lead 26. If desired, this voltage may be derived from an automatic frequency controlling circuit diagrammatically illustrated at 24 in FIG. 4. Or, if desired, synchronizing pulses may be fed into the lead 26 as will be explained more fully hereinafter, in which case rectangle 24 will represent and be replaced by a source of synchronizing pulses.

Output pulses, in the arrangement of FIG. 4, are derived from secondary winding 18 and coupled to transformer 10. One terminal of secondary winding 18 is connected through the shunt circuit, consisting of resistor 28 and condenser 30, to the base 32 of a following transistor amplifier, diagrammatically illustrated at 34. The lower terminal of output transformer 18 is grounded through a sampling resistor 36 of low value. Also, as shown, secondary coil 12 is shunted by a resistor 38.

Figure 3:
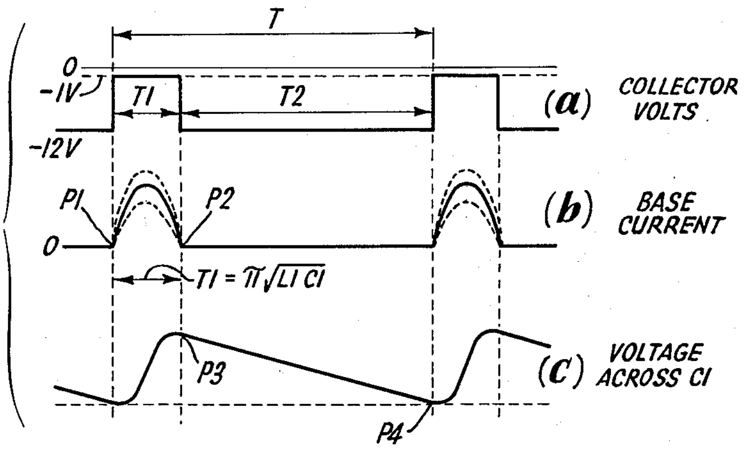
FIG. 3 illustrates waveforms generated in the transistor blocking oscillator of FIG. 2.
Figure 5:
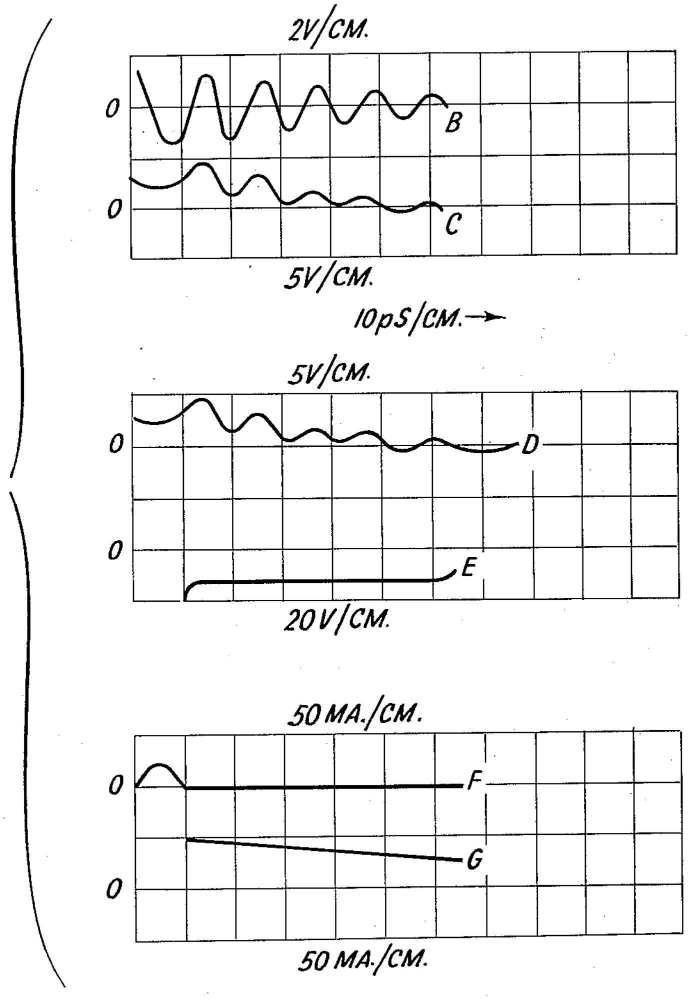
FIG. 5 shows waveforms, explanatory of the operation of my oscillator of FIG. 4.

Idealized waveforms explanatory of the operation of the oscillator of FIG. 4, and explanatory of stabilization as to pulse width and frequency are illustrated in FIGS. 3 and 5.

As explained in connection with FIG. 2, condenser $C_1$ and inductor $L_1$ of FIG. 4 are series tuned and act to stabilize pulse width. Thus as shown in FIG. 3B, the series tuned circuit $C_1$, $L_1$ of FIG. 4 is tuned to a frequency such that one half cycle thereof corresponds to a desired pulse width $T_1$. At the zero intercepts of the series resonated current, namely at points $P_1$ and $P_2$, in FIG. 3B, the pulse is sharply turned on and off. The pulse width is therefore maintained substantially constant and is substantially independent of the amplitude of current flow through the series resonant system $C_1$, $L_1$.

As shown in FIG. 3A, the interpulse period is illustrated as having a time duration of $T_2$. The base voltage waveform that controls the frequency of oscillation is shown in FIG. 3C and is the voltage across condenser $C_1$. At the beginning of this inetrval, indicated by point $P_3$ (see FIG. 3C), condenser $C_1$ is in a charged up condition and starts to discharge through resistor $R_1$, the waveform or envelope of the discharge voltage across the condenser being indicated by the sloping line between points $P_3$ and $P_4$ of FIG. 3C. The time $T_2$ or the time of discharge of condenser $C_1$ is controlled by the value of resistor $R_1$ through which the condenser discharges. When the discharge waveform or envelope reaches zero or intersects the zero axis as at point $P_4$ (FIG. 3) the leading edge of the next pulse is quickly formed.

I have observed that the frequency of oscillation varies with the supply voltage of the oscillator and other changes in parameter such as changes in transistor characteristics. These undesirable changes in frequency are due to changes in the slope of the discharge curve of FIG. 3C between points $P_3$ and $P_4$ which alters the position $P_4$ at which the envelope of the discharge intersects or crosses the zero axis. As a result, the interpulse time, and therefore, the pulse rate, changes.

I have found that the rate of change of base voltage immediately preceding retriggering of the oscillator, when leading edges of the pulses are formed, influences the amount of frequency variation. In accordance with my present invention, I increase the rate of change of voltage preceding triggering or start of pulse formation and thereby secure substanial frequency stability despite changes in supply voltage, transistor characteristics, etc.

Specifically, to stabilize pulse repetition rate or frequency, in accordance with the present invention, exemplified in FIG. 4, condenser $C_2$ is placed in parallel with the pulse width determining inductor $L_1$. This circuit is then tuned to a frequency such that a desired interpulse period $T_2$ (see FIG. 3A), or the interval between the beginning of discharge (point $P_4$, FIG. 3C) and the triggering point $P_3$ when the envelope of the discharge voltage across condenser C crosses the zero axis, contains a whole number of cycles less ¼; for example .75, 1.75, 2.75, 3.75, 4.75, etc.

As a consequence, when the pulse terminates, condenser $C_2$ is in a charged condition ($P_3$, FIG. 3C) and a transient oscillation starts at a frequency determined by the tuning of the parallel tuned circuit $L_1C_2$. Since the number of cycles that occur during the interpulse period is adjusted to be an integer less ¼, triggering on the negative going intercept of the sine wave of discharge, as shown in FIG. 5B, takes place at which time the rate of change of base voltage is sharply increased over the conventional resistance-capacitance slope, and the modified discharge envelope crosses the zero axis at a steep angle. In this way, in accordance with my present invention, both the on-time of the oscillator and the interpulse period are stabilized by resonant circuits, each having stable inductance and capacity components. The combined action results in stabilization of the entire period of the oscillator.

Figure 6:
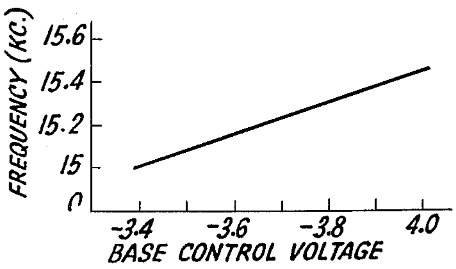
FIG. 6 shows how a transistor oscillator varies in frequency with changes in base control voltage.
Figure 7:
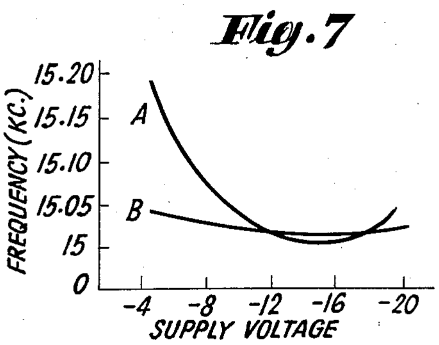
FIG. 7 shows frequency vs. supply voltage curves for a transistorized blocking oscillator with and without the frequency stabilization of my present invention.

FIG. 6 indicates a frequency sensitivity to base bias return voltage of approximately 700 cycles per volt. Curve A, FIG. 7, shows the frequency vs. supply voltage for the transistor blocking oscillator circuit without frequency stabilization. Curve B shows the frequency vs. supply voltage variation for my improved circuit of FIG. 4 and clearly indicates the significant decrease in undesired frequency variations provided by my invention. Similar improvement of frequency stability vs. temperature of the transistor takes place by use of my present invention.

The oscillator of my invention is adjusted to approximately the desired operating frequency by varying either the base bias supply voltage applied through connection 26, or the discharge resistor $R_1$. This permits frequency adjustments from one cycle of the damped sine wave to the next. The precise frequency adjustment desired is made by varying the inductance of coil $L_1$. The exact instant of triggering is adjusted to occur on the steep part of the damped sine wave by simultaneously tuning circuit $L_1C_2$ and setting resistor $R_1$ or the base bias. It should be noted that, capacitor $C_2$ also serves the additional purpose of acting as a high frequency by-pass effective during the edges or regenerative periods of the oscillator thereby increasing the rate of rise of the edges.

The oscillator of FIG. 4 may be frequency and phase locked to incoming synchronizing pulses by applying conventional automatic phase control voltages, through a suitable filter, to point A, FIG. 4.

If it is desired, to change the frequency of the pulses generated with the circuit arrangement of FIG. 4, inductor $L_1$ and capacitor $C_2$ are varied. Changing the tuning of the parallel resonant circuit $L_1C_2$ will change the pulse rate or frequency without much affecting the pulse width. The latter may then be adjusted to a desired value by adjustment of the value of capacitance of condenser $C_1$. Adjustment of condenser $C_1$ does not materially change the pulse frequency.

I have set up and successfully operated the transistor blocking oscillator of the present invention as illustrated in FIG. 4 with the following values and characteristics for the components illustrated. It should be clearly understood, however, that these values are merely illustrative and are not to be considered as restricting my invention thereto.

| | | |
|---|---|---|
| Voltage in line **26** | volts | 12 |
| Resistor $R_2$ | ohms | 500 |
| Resistor $R_1$ | | 1.4–2.5K |
| Condenser $C_1$ | μf | 0.05 |
| Condenser $C_2$ | μf | 0.03 |
| Resistor **20** | ohm | 1 |
| Coil **14** | turns | 25 |
| Coil **12** | do | 100 |
| Coil **18** | do | 50 |
| Transistor **2** | | Type 2N317 |
| Resistor **38** | | 1.2K |
| Resistor **36** | ohm | 1 |
| Condenser **30** | μf | 0.5 |
| Resistor **28** | ohms | 22.0 |

Having thus described my invention, what I claim is:

1. A transistor pulse generator comprising a transistor, a resistor and a capacitor in the base circuit of the transistor for fixing the interpulse period of pulses generated by the generator; a parallel tuned circuit having inductance and capacity, tuned to a frequency such that a whole number of cycles less one quarter equals the time duration of a desired interpulse period, connected between said base and emitter; and a series tuned circuit, tuned to a frequency such that the time of one half cycle equals a desired pulse duration, also connected between said base and emitter.

2. A transistor pulse generator comprising a transistor having a base, a collector and an emitter; a transformer having a pair of coupled windings, one of said windings being connected in the emitter-collector circuit of said transistor and the other winding being connected between the base and emitter of said transistor; a condenser and a resistor connected between said base and emitter for fixing the interpulse period of pulses generated by the generator; a parallel tuned circuit connected between said base and emitter for stabilizing the interpulse period of pulses generated by the generator; and a series tuned circuit connected between said base and emitter for stabilizing the width of pulses generated by the pulse generator.

3. A pulse generator comprising a transistor having an emitter, a base and a collector; a transformer having first and second coupled windings; means for applying collector biasing voltage through the first of said windings to said collector; means for applying biasing voltage through the second winding to said base; a coil and condenser connected in parallel forming a parallel tuned circuit tuned to a frequency such that a whole number of cycles less one quarter taken at said frequency is equal to a desired interpulse period of pulses generated by said generator; a second condenser connected in series with said parallel tuned circuit, said series connected arrangement being connected between said second coil and said emitter, said second condenser and coil being of such value as to series resonate at a frequency such that the time of one half cycle thereof equals a desired time duration for pulses generated by said generator and a resistor connecting said second condenser to said emitter enabling discharge of said condenser.

4. A pulse generator comprising a transistor having an emitter, a base and a collector; means for grounding said emitter; a transformer having first and second coupled windings; means for applying collector biasing voltage through the first of said windings to said collector; means for applying biasing voltage through the second winding to said base; a coil and condenser connected in parallel forming a parallel tuned circuit tuned to a frequency such that a whole number of cycles less one quarter taken at said frequency is equal to a desired interpulse period of pulses generated by said generator; a second condenser connected in series with said parallel tuned circuit, said series connected arrangement being connected in shunt across said second coil and said grounded emitter, said second condenser and coil being of such value as to series resonate at a frequency such that the time of one half cycle thereof equals a desired time duration for pulses generated by said generator and a resistive connection, shunting said series connected condenser and tuned circuit, through which said series connected condenser is periodically discharged.

5. Apparatus for generating voltage pulses comprising a transistor having first, second, and third electrodes; a transformer having first and second windings; a series circuit coupled between the first and second electrodes of said transistor, said series circuit including the first winding of said transformer, a parallel resonant circuit and a series resonant circuit, said parallel resonant circuit including a first condenser and an inductance coupled in parallel therewith and said series resonant circuit including a second condenser connected in series with said parallel resonant circuit, said parallel resonant circuit being tuned to a first resonant frequency corresponding to the period between said pulses and said series resonant circuit being tuned to a second resonant frequency corresponding to the width of said pulses; and output circuit means including the second winding of said transformer coupled between the first and third electrodes of said transistor.

References Cited in the file of this patent

UNITED STATES PATENTS

| | | |
|---|---|---|
| 2,297,742 | Campbell | Oct. 6, 1942 |
| 2,438,845 | Dodds | Mar. 30, 1948 |
| 2,530,427 | Frederick | Nov. 21, 1950 |